(12) United States Patent
Luo et al.

(10) Patent No.: US 11,233,214 B2
(45) Date of Patent: Jan. 25, 2022

(54) DISPLAY SUBSTRATE, DISPLAY DEVICE AND METHOD OF FABRICATING DISPLAY SUBSTRATE

(71) Applicant: BOE TECHNOLOGY GROUP CO., LTD., Beijing (CN)

(72) Inventors: Chengyuan Luo, Beijing (CN); Qing Dai, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 38 days.

(21) Appl. No.: 16/456,752

(22) Filed: Jun. 28, 2019

(65) Prior Publication Data

US 2020/0075879 A1  Mar. 5, 2020

(30) Foreign Application Priority Data

Aug. 31, 2018 (CN) .......................... 201811014871.3

(51) Int. Cl.
*H01L 51/50* (2006.01)
*H01L 27/32* (2006.01)
*H01L 51/52* (2006.01)
*H01L 51/56* (2006.01)

(52) U.S. Cl.
CPC ...... *H01L 51/5096* (2013.01); *H01L 27/3244* (2013.01); *H01L 51/5056* (2013.01); *H01L 51/5088* (2013.01); *H01L 51/5203* (2013.01); *H01L 51/56* (2013.01); *H01L 2227/323* (2013.01)

(58) Field of Classification Search
CPC ............. H01L 51/5096; H01L 27/3244; H01L 51/5056; H01L 51/5088; H01L 51/5203; H01L 51/56; H01L 2227/323; H01L 51/0097; H01L 51/5253; H01L 2251/5315; H01L 51/5271; H01L 27/3246
See application file for complete search history.

(56) References Cited

U.S. PATENT DOCUMENTS

| | | | |
|---|---|---|---|
| 8,174,186 | B2 | 5/2012 | Kim et al. |
| 8,785,919 | B2 | 7/2014 | Yamazaki et al. |
| 8,975,636 | B2 | 3/2015 | Kim et al. |
| 10,431,767 | B2 | 10/2019 | Woo |

(Continued)

FOREIGN PATENT DOCUMENTS

| | | |
|---|---|---|
| CN | 1453883 A | 11/2003 |
| CN | 1691858 A | 11/2005 |

(Continued)

OTHER PUBLICATIONS

Second Office Action dated Sep. 1, 2020 corresponding to Chinese application No. 201811014871.3.

(Continued)

*Primary Examiner* — Julia Slutsker
(74) *Attorney, Agent, or Firm* — Nath, Goldberg & Meyer; Joshua B. Goldberg

(57) ABSTRACT

The present disclosure provides a display substrate, a display device and a method of fabricating the display substrate. The display substrate comprises: a base substrate; a light-emitting layer on the base substrate; and a light-adjusting layer between the light-emitting layer and the base substrate to adjust light emitted by the light-emitting layer.

10 Claims, 3 Drawing Sheets

(56) References Cited

U.S. PATENT DOCUMENTS

| | | | |
|---|---|---|---|
| 2005/0116632 A1* | 6/2005 | Funamoto | H01L 27/3246 313/506 |
| 2005/0236978 A1* | 10/2005 | Kim | H01L 51/5225 313/504 |
| 2008/0252207 A1 | 10/2008 | Yamazaki et al. | |
| 2010/0181559 A1* | 7/2010 | Nakatani | H01L 27/3283 257/40 |
| 2010/0327297 A1 | 12/2010 | Yoshida et al. | |
| 2017/0125719 A1* | 5/2017 | Noh | H01L 51/56 |
| 2019/0214581 A1* | 7/2019 | Morse | H01L 51/0036 |

FOREIGN PATENT DOCUMENTS

| | | |
|---|---|---|
| CN | 102969329 A | 3/2013 |
| CN | 104362257 A | 2/2015 |
| CN | 106505159 A | 3/2017 |
| CN | 106783936 A | 5/2017 |
| CN | 107819079 A | 3/2018 |
| CN | 107887423 A | 4/2018 |
| CN | 108231836 A | 6/2018 |
| JP | 2003-17273 A | 1/2003 |
| JP | 4645064 B2 | 3/2011 |
| JP | 2011-228229 A | 11/2011 |
| WO | 2016/031679 A1 | 3/2016 |

OTHER PUBLICATIONS

Office Action dated Nov. 28, 2019 issued in corresponding Chinese Application No. 201811014871.3.

* cited by examiner

DISPLAY SUBSTRATE, DISPLAY DEVICE AND METHOD OF FABRICATING DISPLAY SUBSTRATE

TECHNICAL FIELD

The present disclosure relates to the field of display technology, more particularly, to a display substrate, a display device, and a method of fabricating a display substrate.

BACKGROUND

Organic Light Emitting Display (OLED) has the advantages of a high response rate, a high contrast ratio, flexibility etc., and is considered to have broad application prospects. In particular, top-emission type OLED devices have higher aperture ratios and become the main direction of OLED display research. However, in the conventional top-emission type OLED device, the light paths along which the light emitted from different positions in an organic functional layer is transmitted to a same observation point are different, resulting in an optical path difference, and thus the light observed at the same observation point and emitted from different light-emitting points has different spectra and different intensities.

SUMMARY

In one aspect, the present disclosure provides a display substrate including: a base substrate; a light-emitting layer on the base substrate; and a light-adjusting layer between the light-emitting layer and the base substrate and configured to adjust light emitted by the light-emitting layer.

According to an embodiment of the present disclosure, a surface of the light-adjusting layer closer to the light-emitting layer is a curved surface that recesses toward the base substrate.

According to an embodiment of the present disclosure; the display substrate further includes: a first electrode between the light-adjusting layer and the base substrate; and a second electrode on a side of the light-emitting layer away from the base substrate.

According to an embodiment of the present disclosure, the display substrate further includes: a carrier-balancing layer between the light-adjusting layer and the light-emitting layer and configured to balance an injection rate of carriers of the first electrode.

According to an embodiment of the present disclosure, the display substrate further includes: a pixel defining layer comprising a lyophilic material layer, a lyophobic material layer and an accommodation portion, wherein the lyophobic material layer is on a side of the lyophilic material layer away from the base substrate; and the light-emitting layer, the light-adjusting layer and the carrier-balancing layer are in the accommodation portion.

According to an embodiment of the present disclosure, a surface of the light-adjusting layer away from the base substrate is not higher than a surface of the lyophilic material layer away from the base substrate.

According to an embodiment of the present disclosure, the carrier-balancing layer is in contact with the light-adjusting layer, an orthographic projection of the carrier-balancing layer on the base substrate covers an orthographic projection of the light-adjusting layer on the base substrate, and a surface of the carrier-balancing layer away from the light-adjusting layer is substantially planar and is substantially at a same level as a surface of the lyophilic material layer away from the base substrate.

According to an embodiment of the present disclosure, the carrier-balancing layer includes at least one of $SiO_2$, ZnO, ZnS, and $TiO_2$.

According to an embodiment of the present disclosure, the first electrode is an anode and the carrier-balancing layer includes hole blocking material.

According to an embodiment of the present disclosure, the light-adjusting layer is between the first electrode and the base substrate.

According to an embodiment of the present disclosure, the light-adjusting layer includes at least one of Au, Ag, Ni, Co, Pt, Pd, Cu, and Al.

In another aspect, the present disclosure provides a method of fabricating a display substrate, including: forming a light-adjusting layer on a base substrate, and forming a light-emitting layer on the light-adjusting layer, wherein the light-adjusting layer is configured to adjust light emitted by the light-emitting layer.

According to an embodiment of the present disclosure, a surface of the light-adjusting layer closer to the light-emitting layer is a curved surface that recesses toward the base substrate, and prior to forming the light-emitting layer, the method further includes: forming a carrier-balancing layer on the light-adjusting layer, the carrier-balancing layer being formed to balance an injection rate of carriers of a first electrode formed on the base substrate.

According to an embodiment of the present disclosure, prior to forming the light-adjusting layer, the method further includes forming a pixel defining layer on the base substrate, wherein the pixel defining layer comprises a lyophilic material layer, a lyophobic material layer, and an accommodation portion, and the lyophobic material layer is on a side of the lyophilic material layer away from the base substrate; wherein forming the light-adjusting layer includes: forming a light-adjusting material solution in the accommodation portion by an inkjet printing process, and performing a drying process on the light-adjusting material solution to form the light-adjusting layer in the accommodation portion; wherein lyophilic property of the light-adjusting material solution is the same as that of the lyophilic material layer, and a surface of the light-adjusting layer away from the base substrate is not higher than a surface of the lyophilic material layer away from the base substrate.

According to an embodiment of the present disclosure, forming the carrier-balancing layer includes: forming a carrier-balancing material solution in the accommodation portion by an inkjet printing process, and forming a drying process on the carrier-balancing material solution to form the carrier-balancing layer in the accommodation portion; wherein lyophilic property of the carrier-balancing material solution is the same as that of the lyophilic material layer, and a surface of the carrier-balancing layer away from the base substrate is substantially at a same level as a surface of the lyophilic material layer away from the base substrate.

According to an embodiment of the present disclosure, the carrier-balancing layer includes at least one of $SiO_2$, ZnO, ZnS, and $TiO_2$.

According to an embodiment of the present disclosure, prior to forming the light-adjusting layer, the method further includes: forming the first electrode on the base substrate, wherein the light-adjusting layer is on a side of the first electrode away from the base substrate.

According to an embodiment of the present disclosure, prior to forming the light-emitting layer, the method further includes forming a plurality of first electrodes on a surface of the carrier-balancing layer away from the base substrate, wherein the plurality of first electrodes are spaced apart from each other by the pixel defining layer.

According to an embodiment of the present disclosure, the light-adjusting layer comprises at least one of Au, Ag, Ni, Co, Pt, Pd, Cu, and Al.

In still another aspect, the present disclosure further provides a display device including a display substrate as described herein or fabricated in accordance with the methods described herein.

DETAILED DESCRIPTION

Figure 1:
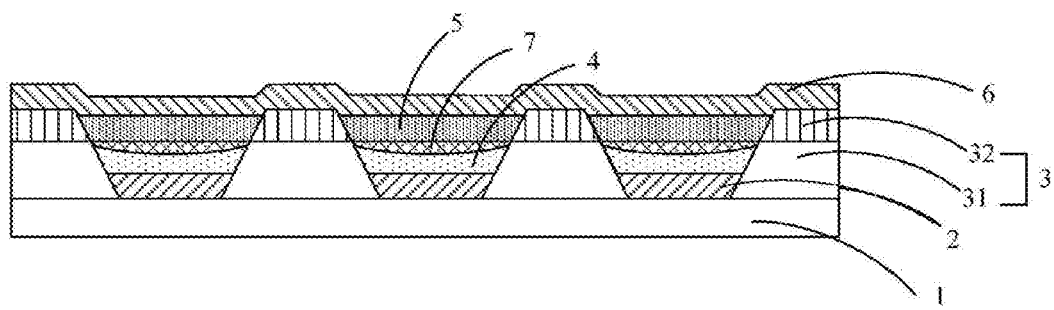
FIG. 1 is a schematic diagram illustrating a structure of a display substrate in some embodiments according to the present disclosure.

The present disclosure will now be described more specifically with reference to the following embodiments. It is to be noted that the following descriptions of some embodiments are presented herein for purpose of illustration and description only. It is not intended to be exhaustive or to be limited to the precise form disclosed, and the same part is omitted in order to avoid redundancy.

The present disclosure is described below with reference to some specific embodiments. In order to keep the following description of the embodiments of the present disclosure clear and concise, detailed descriptions of known functions and components may be omitted. When any component of an embodiment of the present disclosure appears in more than one drawing, the component is denoted by a same reference numeral in each drawing.

The present disclosure provides, inter alia, a display substrate, a method of fabricating the same, and a display device that substantially obviate one or more of the problems due to limitations and disadvantages of the related art. In the present disclosure, by providing the light-adjusting layer, on the one hand, a problem that the viewing angle of the display substrate is narrow can be solved, and on the other hand, the luminous efficiency of the display substrate can be improved.

In one aspect, the present disclosure provides a display substrate. In some embodiments, the display substrate includes: a base substrate; a light-emitting layer on the base substrate; and a light-adjusting layer between the light-emitting layer and the base substrate and for adjusting light emitted by the light-emitting layer.

FIG. 1 is a schematic diagram illustrating a structure of a display substrate in some embodiments according to the present disclosure. Referring to FIG. 1, in some embodiments, the display substrate includes: a base substrate 1, first electrodes 2, a pixel defining layer 3, a light-adjusting layer 4, a light-emitting layer 5, a second electrode 6, and a carrier-balancing layer 7. The first electrodes 2 are on the base substrate 1 and are spaced apart from each other by the pixel defining layer 3, the light-adjusting layer 4 is on a side of the first electrodes 2 away from the base substrate 1, the carrier-balancing layer 7 is on a side of the light-adjusting layer 4 away from the base substrate 1, the light-emitting layer 5 is on a side of the carrier-balancing layer 7 away from the base substrate 1, the second electrode 6 is on a side of the light-emitting layer 5 away from the base substrate 1, the pixel defining layer 3 is on the base substrate 1, the pixel defining layer 3 includes a lyophilic material layer 31 and a lyophobic material layer 32, and the lyophobic material layer 32 is on a side of the lyophilic material layer 31 away from the base substrate 1. In this embodiment, the first electrodes 2 are anodes, and the second electrode 6 is a cathode, but the present disclosure is not limited thereto.

The display substrate shown in FIG. 1 is particularly suitable for a top-emission type OLED substrate, and can solve the problem that the viewing angle of the top-emission type OLED device in the prior art is narrow due to the microcavity effect.

As shown in FIG. 1, a side of the light-adjusting layer 4 closer to the light-emitting layer 5 is a concave curved surface (but the present disclosure is not limited thereto), and the concave curved surface has a light reflection function for reflecting light emitted by the light-emitting layer toward the second electrodes 6. When an OLED device using the display substrate shown in FIG. 1 operates, a part of the light emitted by the light-emitting layer the light toward the light-adjusting layer 4 and the base substrate 1) exits toward a direction away from the base substrate 1 by several times of reflection of the concave curved surface of the light-adjusting layer 4 at different positions, thereby solving the problem that the viewing angle of the top-emission type OLED device is narrow due to the microcavity effect. The light-adjusting layer in the display substrate of the present embodiment is capable of reflecting light emitted by the light-emitting layer as compared to provide the light-adjusting layer on a side of the top electrode (i.e., the second electrode 6 in this embodiment) away from the base substrate in the prior art, thereby improving the luminous efficiency of the OLED device.

As shown in FIG. 1, in some embodiments, the light-adjusting layer 4 is between the first electrode 2 and the light-emitting layer 5. In some embodiments, the light-adjusting layer 4 may include at least one of gold (Au), silver (Ag), nickel (Ni), cobalt (Co), platinum (Pt), palladium (Pd), copper (Cu), and aluminum (Al). In an embodiment, a thickness of the light-adjusting layer 4 at center position thereof is 50 nm to 100 nm.

When the light-adjusting layer 4 is between the first electrodes 2 and the light-emitting layer 5, the light-adjusting layer 4 usually has a concave structure in which the thickness of the edge is larger than that of the center due to the limitation of the fabricating process, which may cause the injection rate of the carriers of the first electrodes 2 to be not uniform when the first electrodes 2 are applied with voltages during operation of the OLED device, thereby affecting the luminous efficiency of the OLED device. Therefore, the display substrate shown in FIG. 1 further includes a carrier-balancing layer 7 between the light-adjusting layer 4 and the light-emitting layer 5 and for balancing the injection rate of the carriers of the first electrodes 2, thereby balancing a current density and thus improving luminous efficiency of the OLED device when the OLED device operates. In order to minimize the influence on the light transmission, the carrier-balancing layer 7 is transparent. In some embodiments, the carrier-balancing layer 7 may include at least one of insulating materials, such as $SiO_2$, ZnO, ZnS, and $TiO_2$. In some embodiments, the carrier-balancing layer 7 may be made of blocking material corresponding to carriers of the first electrodes 2. For example, when the first electrodes 2 are anodes, the carrier-balancing layer 7 may be made of a hole blocking material.

In some embodiments, the carrier-balancing layer 7 is in contact with the light-adjusting layer 4, an orthographic projection of the carrier-balancing layer 7 on the base substrate 1 substantially covers an orthographic projection of the light-adjusting layer 4 on the base substrate 1, and a surface of the carrier-balancing layer 7 away from the light-adjusting layer 4 is substantially planar and is substantially at a same level as a surface of the lyophilic material layer 31 away from the base substrate 1. As shown in FIG. 1, the carrier-balancing layer 7 has a structure in which the thickness of the edge is less than that of the center and which matches with the structure of the light-adjusting layer 4, that is, the surface of the carrier-balancing layer 7 closer to the light-adjusting layer 4 has a convex structure corresponding to the concave structure of the light-adjusting layer 4. Thus, by providing the carrier-balancing layer 7, the injection rate of the carriers of the first electrodes 2 of the OLED device may be balanced by different thicknesses at different positions of the carrier-balancing layer 7 (i.e., different positions of the carrier-balancing layer 7 provide different passing rates for carriers when the carriers pass through), and it is beneficial to the planarization of the display substrate of the present disclosure.

It is to be understood that the display substrate of the present disclosure may further include a thin film transistor (TFT), connection lines, and the like, and details are not described herein.

In another aspect, the present disclosure provides a method of fabricating a display substrate. In some embodiments, the method includes forming a light-adjusting layer on a base substrate, and forming a light-emitting layer on the light-adjusting layer.

In some embodiments, prior to forming the light-emitting layer, the method further includes forming, on the light-adjusting layer, a carrier-balancing layer for balancing an injection rate of carriers of a first electrode to be formed.

In some embodiments, prior to forming the light-adjusting layer, the method further includes forming a pixel defining layer on the base substrate. The pixel defining layer includes a lyophilic material layer, a lyophobic material layer, and accommodation portions, and the lyophobic material layer is on a side of the lyophilic material layer away from the base substrate.

FIGS. 2-6 illustrate a method of fabricating a display substrate in some embodiments according to the present disclosure. For the purpose of explanation, the following description is based on an example that the display substrate is a top-emission type display substrate, and the light-adjusting layer 4 is between the first electrode 2 and the light-emitting layer 5.

Figure 2:
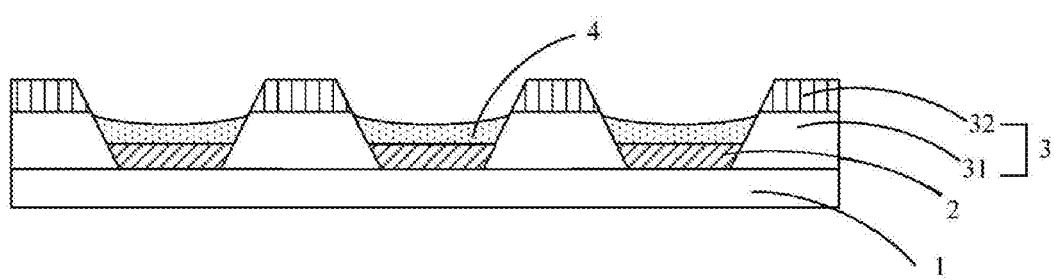
FIG. 2 is a schematic diagram illustrating a structure including a light-adjusting layer formed according to some embodiments of the present disclosure.
Figure 6:
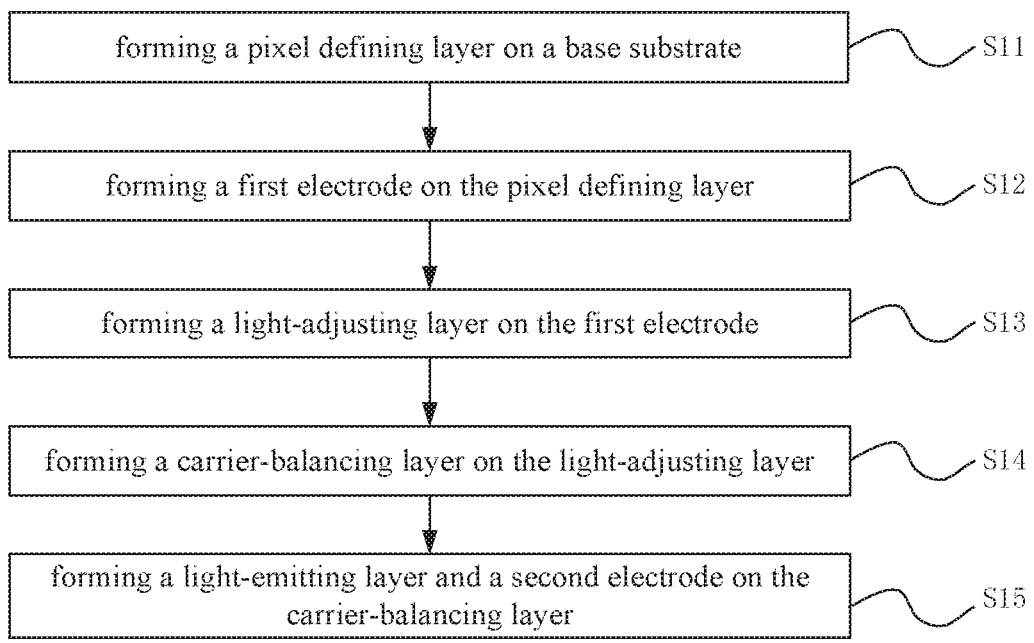
FIG. 6 is a flow chart illustrating a method of fabricating a display substrate in some embodiments according to the present disclosure.

Referring to FIG. 2 in conjunction with FIG. 6, in step S11, a pixel defining layer 3 is formed on a base substrate 1, and the pixel defining layer 3 includes accommodation portions.

In some embodiments, for the purpose of explanation, firstly, a structure including a source electrode, a gate electrode, a drain electrode, and the like of a TFT (not shown) may be formed on the base substrate 1 by a patterning process, a planarization layer provided with a via hole at a position corresponding to the gate is formed over the TFT, and then the pixel defining layer 3 is formed over the planarization layer by a process such as sputtering.

In some embodiments, each of the accommodation portions may be formed by an etching process and may have a height varying from 1 μm to 5 μm.

In some embodiments, the pixel defining layer 3 includes a lyophilic material layer 31 and a lyophobic material layer 32 on a side of the lyophilic material layer 31 away from the base substrate 1, wherein a height ratio between the lyophilic material layer 31 and the lyophobic material layer 32 may varies from 1:3 to 1:2.

As shown in FIG. 2, in some embodiments, in step S11, the lyophilic material layer 31 may be first formed, and then the lyophobic material layer 32 may be formed on the lyophilic material layer 31, and then the accommodation portions penetrating the lyophilic material layer 31 and the lyophobic material layer 32 is formed by a patterning process, thereby forming the pixel defining layer 3 having the accommodation portions. In some embodiments, the lyophilic material layer 31 may include at least one of polyimide, silicon dioxide, and silicon nitride, and the lyophobic material layer 32 may include at least one of fluorinated polyimide, fluorinated polymethyl methacrylate and polysiloxane. In some embodiments, an inorganic material may be formed by magnetron sputtering process, thermal evaporation, or PECVD, and an organic material may be formed by coating process, exposing process, developing process, etching process, and stripping process. In some embodiments, in step S11, the lyophilic material layer 31 may be first formed and partially etched to form the accommodation portions, and then the lyophobic material layer 32 is formed by surface treatment on the lyophilic material layer 31. For example, the surface of the lyophilic material layer 31 is sprayed with a lyophobic material such as fluorinated polymethyl methacrylate or polysiloxane, or subject to plasma processing using tetrafluoromethane (CF4), or treated with fluorinated silane or chlorosiloxane. In some embodiments, the pixel defining layer 3 may be made of a fluorine-containing resin material, and the fluorine-containing resin material (e.g., a mixed material of fluorinated polyimide and polyimide) is baked during fabricating the pixel defining layer 3 to cause the fluorine-containing component in the fluorine-containing resin material to move up to an upper portion of the pixel defining layer during being baked to form a fluorine-containing layer having a certain thickness and a well lyophoby property, and a lower portion of the pixel defining layer below the fluorine-containing layer has a well lyophily property, thereby forming the lyophilic material layer 31 closer to the base substrate 1 and the lyophobic material layer 32 away from the base substrate 1.

Referring again to FIG. 2 in conjunction with FIG. 6, in step S12, a plurality of first electrodes 2 are formed in the plurality of accommodation portions respectively, wherein a corresponding one of the plurality of first electrodes 2 corresponds to one of the plurality of accommodation portions. One of the first electrodes 2 may be coupled to the gate electrode of the corresponding TFT through a via hole. In some embodiments, the first electrode 2 may have a thickness varying from 10 nm to 150 nm, and may include one of Al, Mg, Ag, ITO, IZO, etc.

Referring again to FIG. 2 in conjunction with FIG. 6, in step S13, a light-adjusting layer 4 is formed on the first electrodes 1. In some embodiments, a surface of the light-adjusting layer 4 away from the base substrate 1 is a concave curved surface and is configured for reflecting light emitted by the OLED device (i.e., the light-emitting layer of the OLED device) out of the second electrode 6, but the present disclosure is not in thereto.

In some embodiments, in step S13, a light-adjusting layer 4 is formed by an inkjet printing and drying processes, wherein the surface of the light-adjusting layer 4 away from the base substrate 1 is not higher than the surface of the lyophilic material layer 31 away from the base substrate 1. In some embodiments, a nozzle with a size of 6 pL may be used for quantitative printing, a light-adjusting material solution is formed in the accommodation portions, and then dried in an vacuum oven having uniformly distributed, suction holes to form the light-adjusting layer 4. In some embodiments, the lyophilic property of the light-adjusting material solution is the same as that of the lyophilic material layer 31, and coffee ring effect may occurs to the light-adjusting material solution during being dried by controlling a solute ratio and a printing amount of the light-adjusting material solution. After the solution drops into the accommodation portion to form a droplet, the edge of the droplet climbs along the sidewall of the lyophilic material layer 31. Since an evaporation rate at the center of the droplet with a larger volume per unit area is different from that of the edge of the droplet with a less volume per unit area due to the shape of the droplet, the drying rate of the solvent in the solution at the edge is greater than that of the center. As the solvent at the edge of the droplet is continuously volatilized, the distribution of the solute content at the center becomes different from the edge, thereby forming a concentration gradient, and causing a slight compensating phenomena where the solvent flows from the center to the edge. This phenomena may cause a part of the solute to move to the edge, which leads to an increase of the mass of the solute at the edge, and eventually leads to the formation of the coffee ring effect, thereby forming a concave light-adjusting layer 4 as shown in FIG. 2 in the accommodation portions, wherein the thickness of the edge of the light-adjusting layer 4 is larger than that of the center of the light-adjusting layer 4. It is to be understood that a climbing height of the droplet may be controlled by controlling the height of the lyophilic material layer 31, thereby controlling a curvature of the formed light-adjusting layer 4.

In some embodiments, the solvent in the light-adjusting material solution may be an ink containing 10 wt % of Ag nanoparticle, and the solute in the solution may be one or more of n-pentane, n-hexane, n-heptane, n-octane, n-decane, cyclopentane, cyclohexane, methylcyclopentane, methylcyclohexane, petroleum ether, benzene, toluene, xylene, carbon tetrachloride, ethyl acetate, glycol ether acetate or propylene glycol ether acetate. In some embodiments, the solute in the light-adjusting material solution may also be other conductive nano-materials, e.g., metal nanoparticles such as Au, Ag, Ni, Co, Pt, Pd, Cu, Al, etc.

Figure 3:
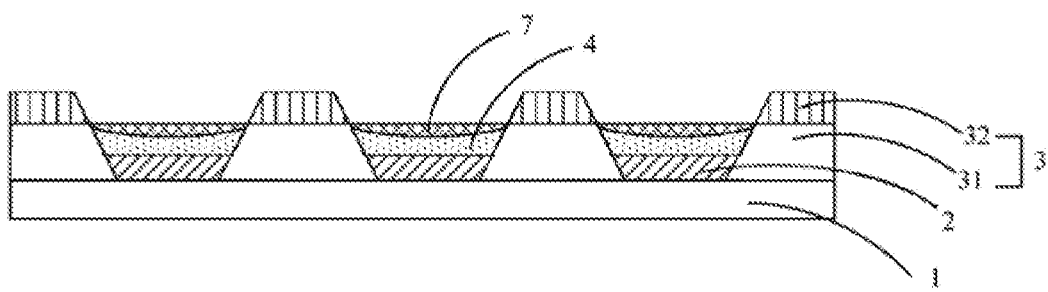
FIG. 3 is a schematic diagram illustrating a structure including a carrier-balancing layer formed according to some embodiments of the present disclosure.

Referring to FIG. 3 in conjunction with FIG. 6, in step S14, a carrier-balancing layer 7 for balancing the injection rate of carriers of the first electrode 2 is formed on the light-adjusting layer 4.

In some embodiments, a carrier-balancing material solution may be formed in the accommodation portion by an inkjet printing process, and the carrier-balancing layer 7 may be formed in the accommodation portion by performing a drying process on the carrier-balancing material solution, wherein the specific steps may refer to step S13 and will not be repeated again.

It should be noted that the carrier-balancing material solution should have the same lyophilic property as the lyophilic material layer 31. When the carrier-balancing layer 7 is formed by an inkjet printing process, the edge of the carrier-balancing material solution of the carrier-balancing layer 7 is prevented from climbing up in the following drying process by controlling the solute ratio and the printing amount of the carrier-balancing material solution, so that there is no coffee ring effect on the carrier-balancing material solution in the drying process. According to an embodiment of the present disclosure, by setting the height of the interface between the lyophilic material layer 31 and the lyophobic material layer 32, the carrier-balancing material solution may be prevented from climbing up in the drying process due to the lyophobic material layer 32, so that the surface of the formed carrier-balancing layer 7 away from the base substrate 1 and the surface of the lyophilic material layer 31 away from the base substrate 1 (i.e., the interface between the lyophilic material layer 31 and the lyophobic material layer 32) are at the same level, that is, a convex structure which has a thick center and a thin edge and matches with the concave structure of the light-adjusting layer 4 as shown in FIG. 3 is formed, thereby balancing the uneven current density caused by the concave light-adjusting layer 4, and improving the luminous efficiency of the OLED device.

In some embodiments, the solute in the carrier-balancing material solution may be a nanoparticle, made of a transparent insulator material, such as $SiO_2$, ZnO, ZnS, $TiO_2$, etc., or may be a nanoparticle made of a blocking material corresponding to the carriers of the first electrode 2. For example, when the first electrode 2 is an anode, the solute of the carrier-balancing material solution may be the nanoparticle made of a hole blocking material.

Figure 4:
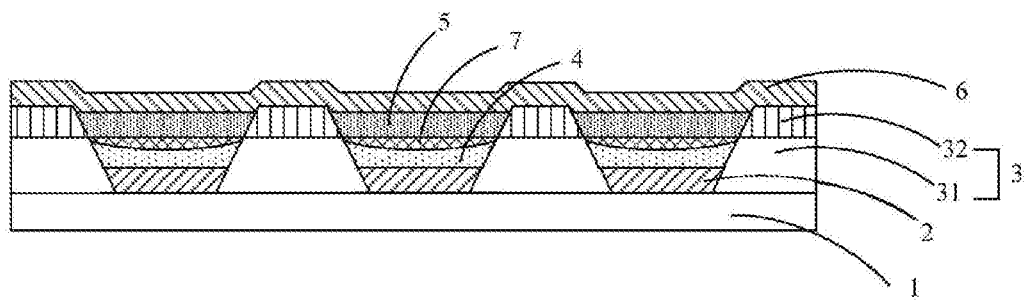
FIG. 4 is a schematic diagram illustrating a structure including a light-emitting layer and a cathode formed according to some embodiments of the present disclosure.
Figure 5:
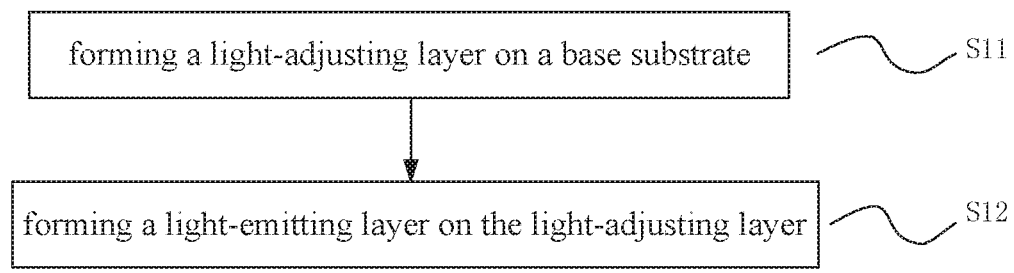
FIG. 5 is a flow chart illustrating a method of fabricating a display substrate in some embodiments according to the present disclosure.

Referring to FIG. 4 in conjunction with FIG. 6, in step S15, a light-emitting layer 5 and a second electrode 6 of the display substrate are formed on the carrier-balancing layer 7.

As shown in FIG. 4, in some embodiments, the light-emitting layer 5 may be formed by an inkjet printing process, a vacuum evaporation process, etc., and the second electrode 6 may be formed by a vacuum evaporation process. In some embodiments, the second electrode 6 may be formed of metallic materials having low work function such as lithium, magnesium, calcium, strontium, aluminum, indium, etc. In some embodiments, the step S15 may further include steps of forming structures of a hole injection layer, a hole transport layer, an electron transport layer, and an electron injection layer of the display substrate, which will not be described in detail herein.

Figure 7:
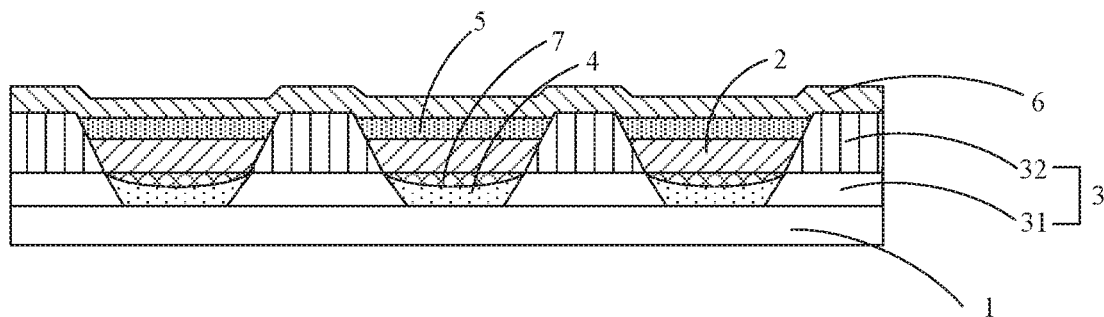
FIG. 7 is a schematic diagram illustrating a structure of a display substrate in some embodiments according to the present disclosure.

FIG. 7 is a schematic diagram illustrating a structure of a display substrate in some embodiments according to the present disclosure. Referring to FIG. 7, in some embodiments, the light-adjusting layer 4 may be between the first electrodes 2 and the base substrate 1. In some embodiments, the first electrodes 2 may be transparent electrodes, so that the light emitted by the light-emitting layer 5 during light emission may pass through the first electrodes 2 and be reflected by the light-adjusting layer 4 to adjust an angle of the light exited from the display substrate. In some embodiments, the first electrodes 2 may be made of a transparent conductive material such as indium tin oxide.

According to the present disclosure, by forming the light-adjusting layer 4 having a concave structure on the side of the light-emitting layer 5 closer to the base substrate 1, and adjusting an angle of the light exited from the display substrate by using the light-adjusting layer 4, the problem that the viewing angle of the top-emission type OLED device is narrow is solved, Meanwhile, with respect to the solution in the prior art, the display substrate of the present disclosure does not need to be provided with a light-adjusting layer above the top electrode (for example, the second electrode of the present disclosure), so that the light extraction efficiency will not be reduced due to light absorption by the light-adjusting layer. Further, the fabricating method of the display substrate according to the present disclosure is simple and easy to handle.

In another aspect, the present disclosure provides a display device including the display substrate as described herein or fabricated by the methods described herein. In some embodiments, the display device includes a display panel. In some embodiments, the display panel includes the display substrate as described herein or fabricated by the methods described herein, and a counter substrate. Suitable display devices include, but not limited to, mobile phones, tablets, televisions, displays, notebook computers, advertising screens, and any product or component having a display function.

It is to be understood that the above embodiments are merely exemplary embodiments employed to explain the principles of the present disclosure, but the present disclosure is not limited thereto. Various modifications and improvements can be made by those skilled in the art without departing from the spirit and scope of the present application, and such modifications and improvements are also considered to be within the scope of the present application.

What is claimed is:

1. A display substrate, comprising:
    a base substrate;
    a light-emitting layer on the base substrate;
    a light-adjusting layer between the light-emitting layer and the base substrate and configured to reflect light emitted by the light-emitting layer;
    a first electrode between the light-adjusting layer and the base substrate;
    a second electrode on a side of the light-emitting layer away from the base substrate;
    a carrier-balancing layer between the light-adjusting layer and the light-emitting layer and configured to balance an injection rate of carriers of the first electrode, and
    a pixel defining layer comprising a lyophilic material layer, a lyophobic material layer and an accommodation portion,
    wherein a surface of the light-adjusting layer closer to the light-emitting layer is a curved surface that recesses toward the base substrate,
    the lyophobic material layer is on a side of the lyophilic material layer away from the base substrate;
    the light-emitting layer, the light-adjusting layer and the carrier-balancing layer are in the accommodation portion,
    a surface of the carrier-balancing layer away from the light-adjusting layer is planar and is at a same level as a surface of the lyophilic material layer away from the base substrate,
    a side surface of the light-emitting layer is in direct contact with a side surface of the lyophobic material layer,
    the display substrate further comprises a hold injection layer, a hole transport layer, and electron transport layer, and an electron injection layer,
    the carrier-balancing layer comprises at least one of $SiO_2$, ZnO, ZnS, and $TiO_2$; and
    the light-adjusting layer comprises at least one of Au, Ag, Ni, Co, Pt, Pd, Cu, and Al.

2. The display substrate of claim 1, wherein
    the carrier-balancing layer is in contact with the light-adjusting layer, and an orthographic projection of the carrier-balancing layer on the base substrate covers an orthographic projection of the light-adjusting layer on the base substrate.

3. The display substrate of claim 2, wherein the first electrode is an anode.

4. A method of fabricating a display substrate, comprising:
    forming a light-adjusting layer on a base substrate; and
    forming a light-emitting layer on the light-adjusting layer,
    wherein the light-adjusting layer is configured to reflect light emitted by the light-emitting layer,
    wherein the display substrate further comprises:
    a first electrode between the light-adjusting layer and the base substrate;
    a second electrode on a side of the light-emitting layer away from the base substrate;
    a carrier-balancing layer between the light-adjusting layer and the light-emitting layer and configured to balance an injection rate of carriers of the first electrode, and
    a pixel defining layer comprising a lyophilic material layer, a lyophobic material layer and an accommodation portion,
    wherein a surface of the light-adjusting layer closer to the light-emitting layer is a curved surface that recesses toward the base substrate,
    the lyophobic material layer is on a side of the lyophilic material layer away from the base substrate;
    the light-emitting layer, the light-adjusting layer and the carrier-balancing layer are in the accommodation portion,
    a surface of the carrier-balancing layer away from the light-adjusting layer is planar and is at a same level as a surface of the lyophilic material layer away from the base substrate,
    a side surface of the light-emitting layer is in direct contact with a side surface of the lyophobic material layer,
    the display substrate further comprises a hole injection layer, a hole transport layer, and electron transport layer, and an electron injection layer,
    the carrier-balancing layer comprises at least one of $SiO_2$, ZnO, ZnS, and $TiO_2$; and
    the light-adjusting layer comprises at least one of Au, Ag, Ni, Co, Pt, Pd, Cu, and Al.

5. The method of claim 4, prior to forming the light-adjusting layer, further comprising:
    forming the pixel defining layer on the base substrate,
    wherein forming the light-adjusting layer comprises:
    forming a light-adjusting material solution in the accommodation portion by an inkjet printing process, and performing a drying process on the light-adjusting material solution to form the light-adjusting layer in the accommodation portion; wherein lyophilic property of the light-adjusting material solution is the same as lyophilic property of the lyophilic material layer.

6. The method of claim 5, wherein forming the carrier-balancing layer comprises:
    forming a carrier-balancing material solution in the accommodation portion by an inkjet printing process, and performing a drying process on the carrier-balancing material solution to form the carrier-balancing layer in the accommodation portion; wherein lyophilic property of the carrier-balancing material solution is the same as lyophilic property of the lyophilic material layer, and a surface of the carrier-balancing layer away from the base substrate is substantially at a same level as a surface of the lyophilic material layer away from the base substrate.

7. The method of claim 5, prior to forming the light-adjusting layer, further comprising:

forming the first electrode on the base substrate.

8. The method of claim 5, prior to forming the light-emitting layer, further comprising:

forming a plurality of first electrodes on a surface of the carrier-balancing layer away from the base substrate, wherein the plurality of first electrodes are spaced apart from each other by the pixel defining layer.

9. A display device, comprising the display substrate of claim 1.

10. A display substrate, comprising:

a base substrate, a light-adjusting layer, a carrier-balancing layer, a first electrode, a light-emitting layer, and a second electrode sequentially stacked in this order, wherein the light-adjusting layer is configured to reflect light emitted by the light-emitting layer, the carrier-balancing layer is configured to balance an injection rate of carriers of the first electrode, and a surface of the light-adjusting layer closer to the light-emitting layer is a curved surface that recesses toward the base substrate.

* * * * *